United States Patent
Samuels (10) Patent No.: US 6,714,883 B1
(45) Date of Patent: Mar. 30, 2004

(54) SYSTEM AND METHOD FOR DISPLAYING OPERATOR-GENERATED ANNOTATIONS OF A TRIGGER SPECIFICATION IN A SIGNAL MEASUREMENT SYSTEM

(75) Inventor: Mason Bradfield Samuels, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 324 days.

(21) Appl. No.: 09/643,137

(22) Filed: Aug. 21, 2000

Related U.S. Application Data (63) Continuation-in-part of application No. 09/260,263, filed on Mar. 1, 1999.

(51) Int. Cl.⁷ .............................................. G06F 19/00
(52) U.S. Cl. ..................................... 702/68; 345/780
(58) Field of Search ............................ 702/57, 66–68, 702/70; 345/168, 400, 762–764, 780; 714/724, 736; 375/10; 717/39; 708/212

(56) References Cited

U.S. PATENT DOCUMENTS

| | | | | |
|---|---|---|---|---|
| 4,779,028 A | * | 10/1988 | Blair | 315/367 |
| 5,081,592 A | * | 1/1992 | Jenq | 702/68 |
| 5,526,268 A | * | 6/1996 | Tkacs et al. | 704/8 |
| 5,581,678 A | * | 12/1996 | Kahn | 345/440 |
| 5,651,108 A | * | 7/1997 | Cain et al. | 345/763 |
| 5,953,009 A | * | 9/1999 | Alexander | 345/771 |
| 6,088,029 A | * | 7/2000 | Guiberson et al. | 345/808 |
| 6,098,028 A | * | 8/2000 | Zwan et al. | 702/120 |
| 6,195,617 B1 | * | 2/2001 | Miller | 702/125 |
| 6,327,544 B1 | * | 12/2001 | Samuels | 702/70 |
| 6,396,517 B1 | * | 5/2002 | Beck et al. | 345/771 |
| 6,421,619 B1 | * | 7/2002 | Daniels et al. | 702/66 |

OTHER PUBLICATIONS

Munro, Allen. RIDES Reference Manual. Jul 30, 1996. http://btl.usc.edu/rides/documentn/refMan/index.html. Chapter 11.*

* cited by examiner

*Primary Examiner*—Marc S. Hoff
*Assistant Examiner*—Mary Catherine Baran (57) ABSTRACT

A system and method for use in signal measurement systems that acquire and store signal data in accordance with a trigger specification. The present invention stores and displays operator-generated annotations with each trigger branch of a trigger specification. The annotations, referred to herein as trigger branch comments, can provide meaningful information about, for example, the trigger branch condition, occurrence specification or resulting action, as well as any other aspect of the trigger specification. The branch comments are stored with the associated trigger branch as part of the instrument configuration, and are automatically restored when the configuration data is loaded into the instrument, and printed with the associated trigger branch. The display of the trigger branch comments for each trigger branch may be controlled individually or collectively to enable the operator to configure the display of the trigger specification as needed. The trigger branch comments may be provided through the use of a text editor, programmatically or through a file or data transfer. Advantageously, the operator can annotate the trigger sequence levels and branches as they are developed to facilitate insight, understanding and recollection for the same and other operators. Providing branch comments facilitates the use of previously generated and stored trigger specifications to form a new, more complex trigger specification.

14 Claims, 7 Drawing Sheets

| 208 | 210 | 212 | 214 | 216 | 218 | 222 | 224 |
|---|---|---|---|---|---|---|---|
| TRIG SPEC | TRIGGER SEQUENCE | TRIGGER BRANCH | EVENT LIST | OCC SPEC | ACTIONS | DISPLAY CONTROL | COMMENTS |
| 1 | 1 | 1 | EVENT 1<br>EVENT 2 | # | ACTION 1<br>ACTION 2 | Y/N | TEXT |
|  |  | 2 |  |  |  |  |  |
|  |  | 3 |  |  |  |  |  |
|  |  | 4 |  |  |  |  |  |
|  | 2 |  |  |  |  |  |  |

308
TRIGGER SPECIFICATION
DATA STRUCTURE

SYSTEM AND METHOD FOR DISPLAYING OPERATOR-GENERATED ANNOTATIONS OF A TRIGGER SPECIFICATION IN A SIGNAL MEASUREMENT SYSTEM

RELATED APPLICATIONS

This application is a continuation-in-part of copending U.S. patent application Ser. No. 09/260,263 entitled "Automatic Storage of A Signal Definition in a Signal Measurement System," filed Mar. 1, 1999 and naming as inventor Mason B. Samuels.

BACKGROUND OF THE INVENTION

1. Field of the Invention

The present invention relates generally to signal measurement systems and, more particularly, to enabling an operator to annotate trigger specifications and displaying such annotations with the associated trigger specification in a signal measurement system.

2. Related Art

Analyzers and testers are commonly available to assist in the development, manufacturing and troubleshooting of complex digital electronic/software devices and integrated circuits having incorporated therein microprocessors, random-access memories (RAM), read-only memories (ROM), and other circuits. Such analyzers and testers, generally referred to as signal measurement systems herein, include logic analyzers, digital oscilloscopes, protocol analyzers, microprocessor emulators, bit error rate testers, network analyzers, among other instruments. Logic analyzers in particular have emerged for this purpose and are commercially available from a number of vendors, such as Agilent Technologies, Inc., Tektronix, Inc., and others.

Logic analyzers are digital data acquisition instruments that allow an operator to acquire and display digital signal data from a large number of logic signals ("signals"), such as those that travel over address, data and control lines of a device under test. A device under test may include one or more separately packaged devices such as those noted above, as well as other circuits and devices.

The signals are acquired from the device under test on hardwired lines referred to as channels. The channels may be physically assembled into groups commonly referred to as pods. The received signals are sampled and digitized to form signal data. Digitizing typically includes comparing a voltage magnitude of each logic signal sample to a reference voltage threshold to determine the logic state of the signal. Sampling may occur at one of a number of selectable rates, depending on the frequency at which the sampled signals change logic states. The resultant signal data are stored, under the control of a sampling clock, in a signal data memory generally having a fixed size. The data are typically stored in a sequential manner such that consecutive signal samples are stored in consecutive memory locations. Due to the quantity of signal data, signal data memory is commonly implemented as a wrap-around buffer.

Selection of the portion of the signal data that is separately stored and subsequently presented on the display is determined by an operator-defined trigger specification (also referred to as a trigger set-up). A trigger specification is functionally divided into one or more sequence levels to assist in the development and definition of complex trigger specifications. Each sequence level, in turn, includes one or more trigger branches. Each trigger branch includes one or more trigger events and an occurrence specification together identifying the condition under which functions defined by an action list of the trigger branch are performed. Typically, this includes an identification of the signal data that is to be captured.

A trigger event is defined as an occurrence of certain characteristics or properties of a signal, such as a rising or falling edge, a logic high or logic low signal state, etc. Events may also be defined based on internal resources, such internal timers, counters, etc. Typically, a branch condition specifies a number of events that occur simultaneously or in a relative time sequence. An occurrence specification identifies the number of times the trigger condition is to occur, the timing of the trigger condition relative to some other event, etc.

Thus, a trigger specification is comprised of one or more trigger sequence levels each including any number of trigger branches each of which sets forth a branch condition that causes the logic analyzer to execute the action defined in that trigger branch. Such execution results in the storage of signal data or further processing of a subsequent sequence level. A predetermined quantity of signal data occurring before and after the specified trigger condition is stored in memory for subsequent analysis.

After the trigger specification is specified, the operator can perform a measurement; that is, initiate acquisition of signal samples. When signal data capture is initiated, the signal data is compared to the trigger specification. When the trigger specification is satisfied, the signal data is captured in accordance with specified trigger control parameters or simply, trigger controls. Trigger controls identify the characteristics of the captured signal data. Subsequently, the signal data memory may be sequentially accessed and signal data displayed.

Constructing a proper trigger specification can be very a complicated and time consuming process. A common approach to developing a trigger specification is to construct and test individual portions of a trigger specification at a given time. As each sequence level or trigger branch is verified, additional layers of complexity are added to the previously verified trigger specification. For example, operators often begin trigger specification development with a simple trigger, perform an acquisition, and examine the captured data. If the results are as anticipated, then the operator adds another trigger branch or another event to an existing trigger branch further define the trigger specification. If the trigger branch or sequence level does not operate as desired, the operator will eliminate one or more of the recently-added portions of the trigger specification in an attempt to return to a trigger specification that is known to operate as desired. The operator may then perform another attempt to develop the next branch condition. This process is repeated until the current portion of the trigger specification operates as anticipated before additional layers of complexity are added.

Unfortunately, many trigger specifications are very complex with many sequence levels with complex trigger branches, all integrated into a single trigger specification to capture specific signal data. Commonly operators find it difficult to recall the function of individual trigger branches and sequence levels, particularly when the operator created many similar trigger sequence levels and specifications or has done so some distant time in the past. For example, many operators develop many complex trigger specifications that they store for use and reuse over extended periods of time. Also, trigger specifications are often shared among operators. A more experienced operator often generates and stores several generic trigger specifications for subsequent combination and modification by more novice operators to create a desired trigger specification. Unfortunately, these novice operators often cannot understand the purpose or function of the stored trigger specifications. Not only do such operators spend considerable time attempting to decipher the trigger specification, the novice operator that is not familiar with the triggering process is often prevented from invoking useful acquisitions without further assistance or guidance from a more experienced operator. This is problematic in that a more experienced operator may not be available and the labor costs associated with the measurement increase significantly. Such a burden adversely affects the efficiency with which the logic analyzer is utilized.

SUMMARY OF THE INVENTION

The present invention is a system and method for use in signal measurement systems that acquire and store signal data in accordance with a trigger specification. The present invention stores and displays operator-generated annotations with each trigger branch of a trigger specification. The annotations, referred to herein as trigger branch comments, can provide meaningful information about, for example, the trigger branch condition, occurrence specification or resulting action, as well as any other aspect of the trigger specification. The branch comments are stored with the associated trigger branch as part of the instrument configuration, and are automatically restored when the configuration data is loaded into the instrument, and printed with the associated trigger branch. The display of the trigger branch comments for each trigger branch may be controlled individually or collectively to enable the operator to configure the display of the trigger specification as needed. The trigger branch comments may be provided through the use of a text editor, programmatically or through a file or data transfer. Advantageously, the operator can annotate the trigger sequence levels and branches as they are developed to facilitate insight, understanding and recollection for the same and other operators. Providing branch comments facilitates the use of previously generated and stored trigger specifications to form a new, more complex trigger specification.

A number of aspects of the invention are summarized below, along with different embodiments of each of the summarized aspects. It should be understood that the embodiments are not necessarily inclusive or exclusive of each other and may be combined in any manner that is non-conflicting and otherwise possible, whether they be presented in association with a same or different aspect of the invention. It should also be understood that these summarized aspects of the invention are exemplary only and are considered to be non-limiting.

In one embodiment of the invention, a system for use in a signal measurement system such as a logic analyzer or oscilloscope that acquires and stores signal data in accordance with a selected trigger specification is disclosed. The selected trigger specification comprises a plurality of elements including one or more triggers sequences each having at least one trigger branch. The system is configured to display an operator-generated annotation in graphical association with an associated trigger specification element on a user interface operatively coupled to the signal measurement system. In one particular embodiment, the trigger specification elements comprise trigger branches while the trigger specification annotations comprise trigger branch comments.

In one embodiment, the system includes a text editor configured to provide a text edit area on the user interface through which operator text or editing commands are received. The system logically relates the operator-generated trigger specification annotation with the associated trigger specification element. Alternatively, the trigger specification annotations can be generated programmatically. The trigger branch comments can be displayed in an edit display mode or read-only display mode and can be graphical associated in any known manner, such as by displaying the trigger branch comment adjacent to and above the associated trigger branch.

In another embodiment, a logic analyzer is disclosed. The logic analyzer includes a graphical user interface and a trigger manager. The trigger manager is constructed and arranged to provide the operator with the ability to create, modify, view and annotate a trigger specification on the graphical user interface. The trigger manager acquires and stores signal data in accordance with a selected trigger specification. The trigger specification includes a plurality of elements including one or more trigger sequences each having at least one trigger branch. The trigger manager is configured to display the operator-generated annotation in graphical association with an associated trigger specification element on the graphical user interface. The trigger specification elements preferably comprise trigger branches while the trigger specification annotations comprise trigger branch comments. The graphical association can comprise any graphical technique such as displaying the trigger branch comment adjacent to and above the associated trigger branch.

In a further embodiment of the invention, a method for displaying operator-generated trigger branch comments on a user interface of a logic analyzer is disclosed. The method includes the steps of: displaying, for a selected trigger branch, a text edit field; receiving operator provided text in the text edit field; saving the operator provided comments with the associated trigger branch; and displaying the operator-generated trigger branch comments and the trigger specification such that each of the operator-generated trigger branch comments is graphically associated with the associated trigger branch.

Various embodiments of the present invention provide certain advantages and overcome certain drawbacks of the conventional techniques. Not all embodiments of the invention share the same advantages and those that do may not share them under all circumstances. Further features and advantages of the present invention as well as the structure and operation of various embodiments of the present invention are described in detail below with reference to the accompanying drawings. In the drawings, like reference numerals indicate identical or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

The present invention is directed to systems and methodologies for use in signal measurement systems that acquire and store signal data in accordance with a trigger specification. The present invention graphically associates operator-generated annotations with elements of a trigger specification, such as trigger branches. The annotations are displayed on a user interface in any manner that enables an operator to visually associate the annotation with the associated trigger specification element. The trigger specification annotations are stored with the associated trigger element as part of the instrument configuration, and are restored automatically when the configuration data is loaded into the instrument. In addition, printing of the trigger specification results in the printing of the annotations as well, facilitating the documentation of the trigger specification. The trigger specification annotations can be generated by the operator through the use of a text editor, programmatically or through data transfer.

The trigger specification annotations may include any information desired by the operator such as descriptions of the associated element, instructions, etc., depending on the purpose. For example, an annotation for the purpose of documenting the trigger specification would likely be different than an annotation to remind the operator of the functions performed by that trigger specification element. Thus, the operator can annotate the trigger specification to facilitate insight, understanding and recollection for the same and other operators currently as well as in the future. Providing comments facilitates the use of previously generated and stored trigger specifications to form a new, more complex trigger specification.

In the particular embodiment disclosed herein the trigger specification annotations are limited to trigger branches; that is, each trigger branch of a trigger specification may have an associated annotation, referred to herein as a trigger branch comment. Such trigger branch comments can include any information desired by the operator such as information about the trigger branch condition, including the trigger branch events and occurrence specification, the action(s) specified for the trigger branch, the relationship between this trigger branch and the other trigger branches in the sequence level, etc. The display of the trigger branch comments for a trigger specification may be controlled individually or collectively to enable the operator to configure the display of the trigger specification as needed.

Figure 1:
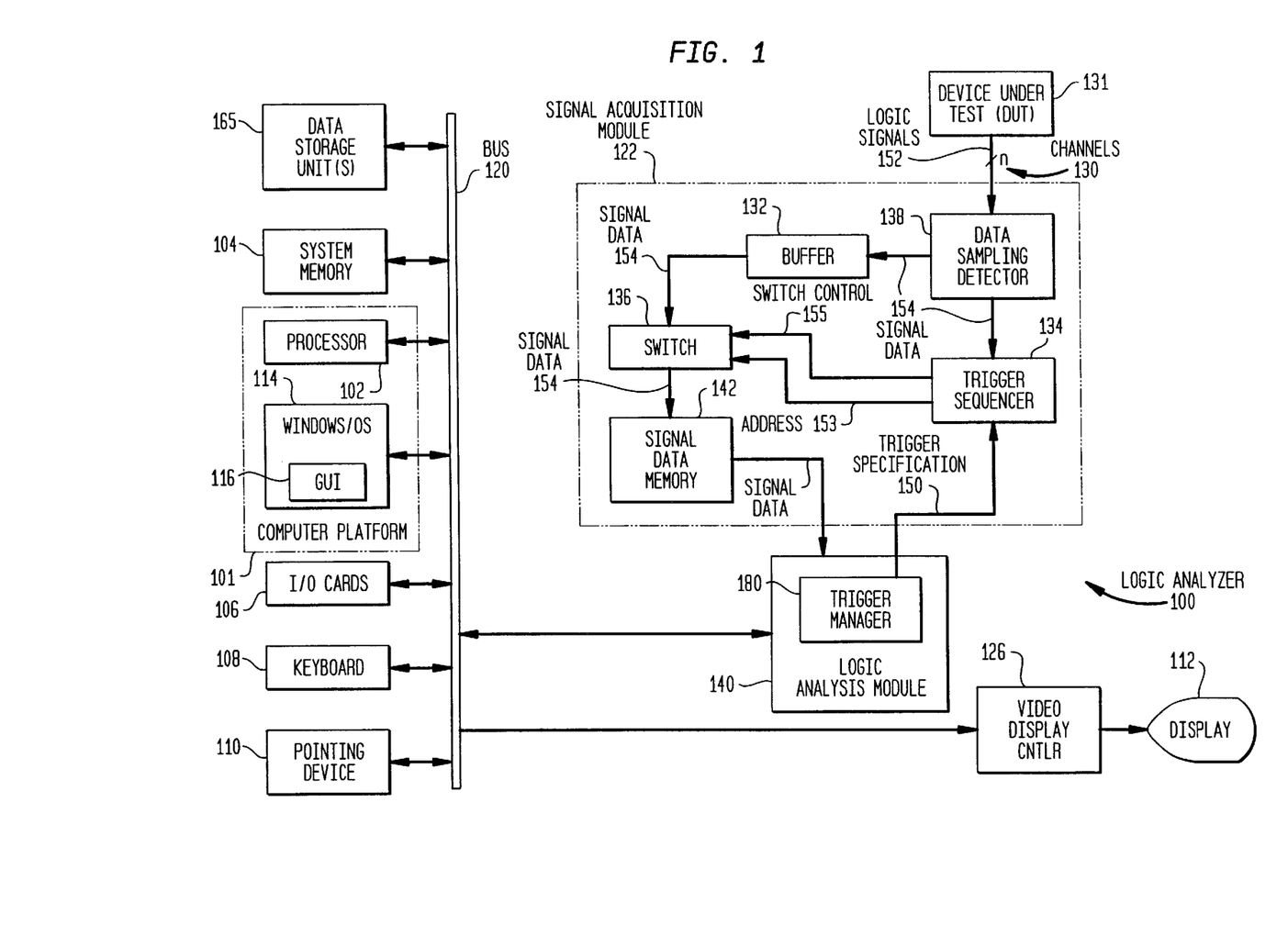
FIG. 1 is a functional block diagram of an exemplary logic analyzer in which embodiments of the present invention may be implemented.

As noted, the present invention may be implemented in any signal measurement system that acquires signal data in accordance with a trigger specification. Aspects of the present invention will be described with reference to exemplary signal measurement system, a logic analyzer. FIG. 1 is a functional block diagram of such a logic analyzer.

Logic analyzer 100 acquires, analyzes and displays a wide variety of signals generally in terms of the logic level of the signals versus time. In the illustrative embodiment shown in FIG. 1, logic analyzer 100 includes a general purpose computer system which is programmable using a high level computer programming language, and specially programmed, special purpose hardware for performing signal acquisition, analysis and display functions. It should become apparent from the following description that the present invention may be implemented in other environments such as a special purpose program operating on an on-board processors, ASICs, firmware, hardware, or a combination thereof.

Logic analyzer 100 includes processor 102, system memory 104, input/output (I/O) cards 106, storage units 105 such as a hard disk drive, floppy disk drive, etc. Analyzer 100 may also include one or more user input/output devices such as keyboard 108, pointing devices 110 and display 112. System memory 104 is used for storage of program instructions in addition to other computer-readable programs and data. In a preferred embodiment, system memory 104 includes random access memory (RAM). Display 112 is preferably a cathode ray display and is logically or physically divided into an array of picture elements (pixels). Input/output (I/O) interface cards 106 may be modem cards, network interface cards, sound cards, and the like.

Processor 102 is typically a commercially available processor, such as the PA-RISC processor from Hewlett-Packard Company, Pentium microprocessor from Intel Corporation, or PowerPC and 68000 series microprocessors from Motorola. Many other processors are also available. Such a processor executes a program referred to as an operating system 114, providing a graphical user interface (GUI) 116 and a windowing system, such as the various versions of the Windows operating systems from Microsoft Corporation, the NetWare operating system available from Novell, Inc., or the Unix operating system available from many vendors such as Sun Microsystems, Inc., Hewlett-Packard Company and AT&T. The operating system 114 controls the execution of other computer programs such as software embodiments of logic analysis module 140, and provides scheduling, input-output control, file and data management, memory management, and communication control and related services. Processor 102 and operating system 114, generally define a computer platform shown by dashed block 101, for which application programs in high level programming languages may be written. The functional elements of logic analyzer 100 communicate with each other via system bus 120.

Signal acquisition module 122 contains circuitry and software that samples and digitizes logic signals 152 from device under test 131. Signal acquisition module 122 receives logic signals 152 from device under test 131 via channels 130. Signal acquisition module 122 includes a data sampling detector 138 that receives and digitizes logic signals 152. Preferably, samples of logic signals 152 are obtained at regular time intervals. The time interval may be operator-specified or synchronized with one of the logic signals 152 received from device under test 131, such a clock signal generated by DUT 131. Signal data 154 is a sampled and digitized representation of logic signals 152. The signal data acquisition module 122 also includes a buffer 132 that receives and temporarily stores signal data 154 from data sampling detector 138.

A trigger sequencer 134 selects the portion of signal data 154 for subsequent storage and display based on a operator-defined trigger specification 150. A trigger specification 150 is specified generally by two parameters, a trigger definition that identifies the occurrences under which signal data is to be stored and a trigger position that identifies the relative position of the occurrence defined by the trigger definition. Trigger sequencer 134 stores in memory a predetermined quantity of signal data occurring before and after the specified occurrence. Trigger sequencer 134 provides switch control 159 to switch 136. Switch 136 allows passage of sample logic signals 154 from buffer 132 to a data storage memory 142.

Logic analyzer 100 also includes a video display controller 126. Computer platform 101 drives video display controller 126 using standard windows applications program interfaces (API) and display data from logic analysis module 140 to the operator on display 112 under the control of video display controller 126.

Logic analysis module 140 includes a trigger manager 180 that provides the operator with the ability to create and modify trigger specifications for capturing desired signal and bus information occurring at channels 130. In accordance with the present invention, trigger manager 180 provides the operator with the ability to annotate each element, such as a trigger branch, of a trigger specification, and to control the display of the annotations. In the illustrative embodiment wherein the annotated elements are trigger branches, the annotations themselves are referred to herein as trigger branch comments.

Figure 2:
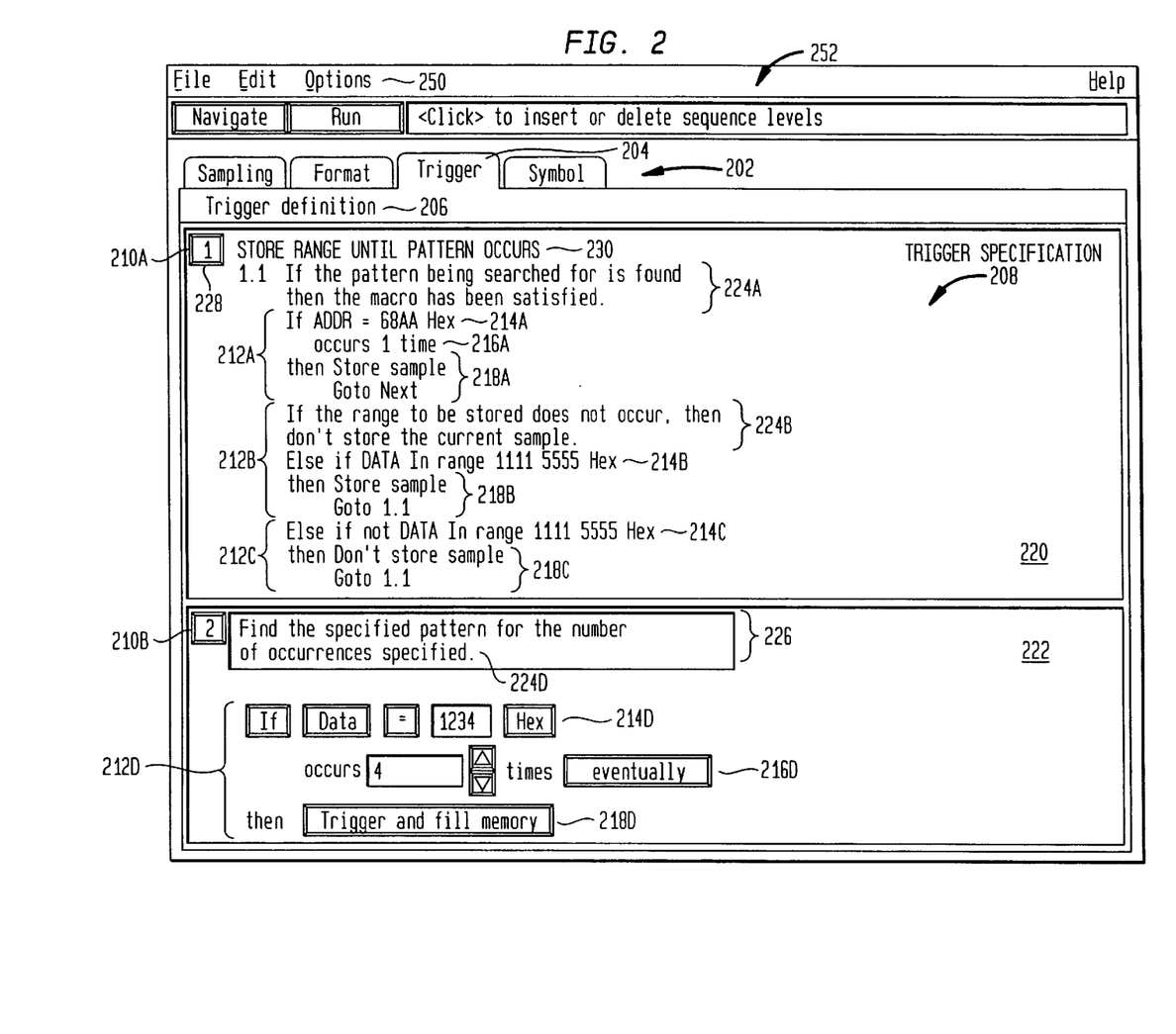
FIG. 2 is an illustration of a graphical user interface display screen showing the trigger branch comments implemented in a trigger specification in accordance with one embodiment of the present invention.

Trigger manager 118 provides the operator with the ability to create, modify view and annotate a trigger specification on graphical user interface 116. FIG. 2 is a graphical user interface display in accordance with one embodiment of the present invention illustrating the display of a trigger specification that has been annotated by an operator in accordance with aspects of the present invention.

As shown in FIG. 2, a display 200 provides tabbed windows, each associated with a main function of logic analyzer 100. In this illustrative embodiment, a primary tier 202 of tabs is shown at the top of display 200. A "Trigger definition" window 206 is displayed in response to the graphical selection of a "Trigger" tab 204 located in tab tier 202. Generally, within trigger definition window 206 all or a portion of a trigger specification is presented to the operator for viewing, modification, etc. In the embodiment shown in FIG. 2, trigger definition window 206 has displayed therein all of a selected trigger specification 208. The term trigger definition is often used interchangeably with the term trigger specification.

As noted, a trigger specification includes one or more sequence levels. Referring to the illustrative embodiment shown in FIG. 2, trigger specification 208 includes a trigger sequence "1" 210A and a trigger sequence "2" 210B. Each trigger sequence level 210 includes at least one trigger branch 212. For example, sequence level 1 210A includes three trigger branches 212A–212C. Each trigger branch 212 includes a list 214 of trigger events ("trigger event list 214") and an occurrence specification 216 that together define a trigger branch condition. The occurrence of the trigger condition causes the trigger branch to be executed and the specified action(s) 218 to occur.

Each trigger event in a trigger event list 214 defines certain characteristics or properties of a signal, such as a rising or falling edge, logical signal state, etc. Trigger events may also be defined based on internal resources, such as internal timers, counters, etc. In the embodiment illustrated in FIG. 2, trigger branch 212A includes a trigger event list 214A, trigger branch 212B includes a trigger event list 214B and trigger branch 212C includes a trigger event list 214C. Although a trigger branch typically specifies a number of trigger events that occur simultaneously or in a relative time sequence, each of the illustrated trigger event lists 214 include a single trigger event for simplicity. Trigger event occurrence specification 216 identifies the number of times the trigger event list is to occur, the timing of the trigger event relative to some other event, etc. In the illustrative embodiment, only the first trigger branch of each trigger sequence 210; that is, trigger branches 212A and 212D, display a trigger occurrence specification 216A. The remaining trigger branches 212 of each sequence level 210 have an occurrence specification of 1; that is, the trigger condition is satisfied when the trigger event list 214 occurs once. Action list 218 identifies the action(s) that is/are to performed, including the capturing of signal data, that is to occur in response to the occurrence of the associated trigger branch condition.

As shown in FIG. 2, trigger branches 212 of each trigger sequence level 210 are processed and arranged in an "if-then-else" structure. That is, trigger manager 180 first determines if the first trigger branch condition is satisfied and, if so, performs the actions 218 specified in that trigger branch. If the first trigger branch condition is not satisfied, then the trigger branch condition defined in the second trigger branch is processed to determine if that condition is satisfied, and so on. Thus, a signal trigger branch 212 of each trigger sequence 210 is executed during a measurement operation.

In accordance with the present invention, the operator may annotate any element of trigger specification 208. In one embodiment, the annotations can be associated with individual trigger branches 212 and, therefore, are referred to herein as trigger branch comments 212. Thus, trigger branch 212A may include a trigger branch comment 224A while trigger branch 212B includes a trigger branch comment 224B. Trigger branch 212C does not include a trigger branch comment 224, as the operator chose not to annotate that particular trigger branch. Trigger branch 212D, shown in edit display mode (described below), includes a trigger branch comment 224D presented in a text edit area 226 (also described below).

Each trigger branch comment 224 is displayed in a manner that enables the operator to visually correlate the comment with the associated trigger branch. As shown in FIG. 2, this graphical association is achieved simply by placing the trigger branch comment 224 adjacent to and above the associated trigger branch. It should be understood, however, that there are a myriad of approaches that one may implement to graphically associate the trigger branch comments with the trigger branches. For example, the comments can be located in a different relative position, can be displayed in a flag, button, etc. with some indicator such as a reference line, color scheme or the like to assist the operator with the visual association.

It should also be understood that in alternative embodiments, additional or different elements of a trigger specification may be annotated by the operator. For example, in one alternative embodiment, the operator can annotate each sequence 210. Referring to FIG. 2, adjacent to button 228 in which the number 1 is displayed to identify the trigger sequence 210A as trigger sequence 1. Adjacent to button 228 there is a trigger function title 230 "STORE RANGE UNTIL PATTERN OCCURS." This title is derived from other sources unrelated to the present invention. However, a comment could be located, for example, below the title 230 to provide the operator with the opportunity to further elaborate on the purpose or function of the trigger sequence 210A. Similarly, in alternative embodiments, the operator may separately annotate individual components of a trigger branch, such as the event list 214, occurrence spec 216 and/or action list 218.

Trigger specification 208 may be presented in trigger definition window 206 in a read-only display mode, or in an mode that enables the operator to modify the specification data. In the illustrative embodiment, this display mode for each high-level trigger sequence 210 can be controlled by the operator. As shown in FIG. 2, for example, trigger sequence 1 210A is displayed in a read-only mode while trigger sequence 2 210C is displayed in an edit mode. Trigger manager 180 can be configured to enable the operator to control the display mode of the individual trigger sequences 210 using any graphical technique such as graphically selecting a point in the region 220 or 222 in which the trigger sequence 210 is displayed using a mouse or other pointing device.

Display of trigger branch comments 224 may be controlled individually or collectively by the operator. In the illustrative embodiment, trigger branch comment display is controlled collectively by the operator; that is, the trigger branch comments may all be displayed or no trigger branch comments are displayed in response to an operator selection on the user interface. This is because it is anticipated that should the operator desire to read one trigger branch comment, the operator will likely desire to read the comments associated with the neighboring trigger branches. To avoid having to individually turn each comment on or off, this embodiment provides the operator with as single display control. Such display control may be provided to the operator through a button, icon or menu item that may be selected by the operator. In one embodiment, for example, selection of the "Options" menu item 250 on main menu 252 causes the display of a pull-down menu (not shown) containing an operator-selectable display element that may be selected to control the display of trigger branch comments 224.

Figure 3A:
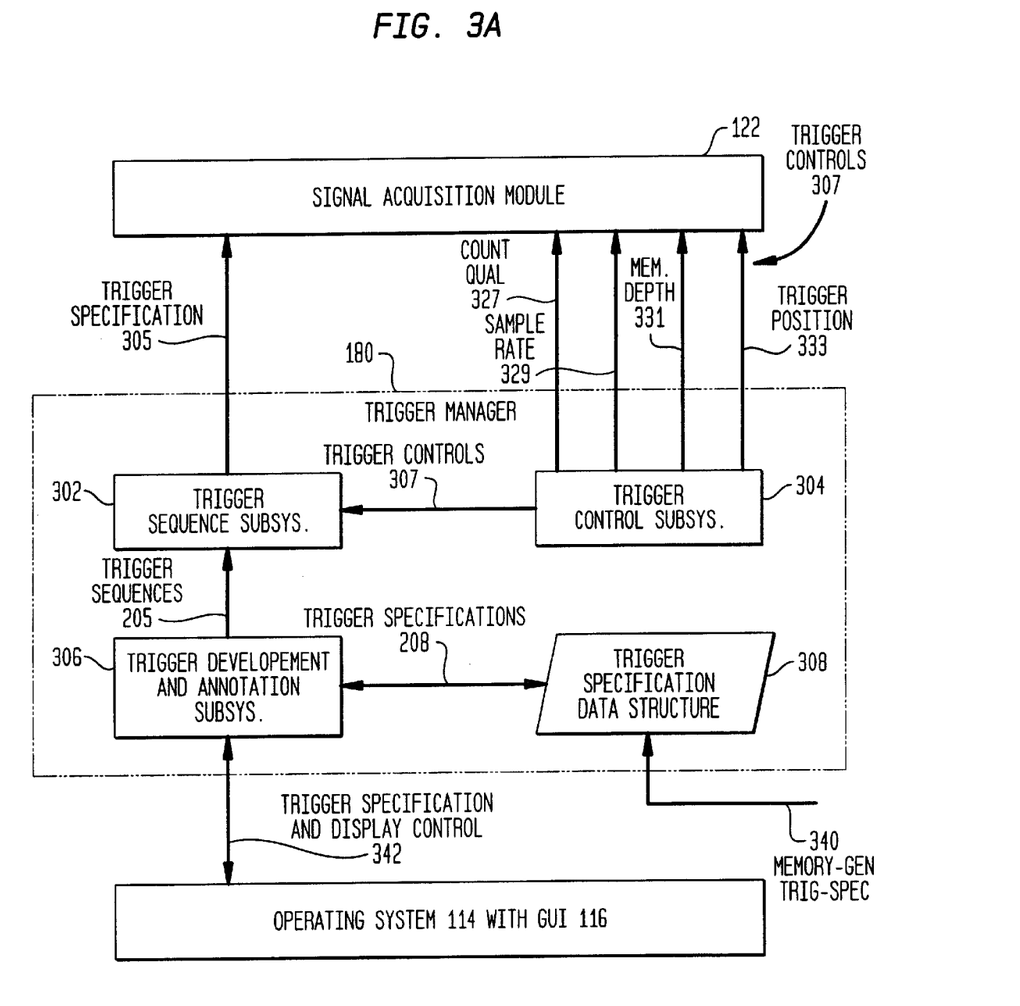
FIG. 3A is a functional block diagram of a trigger manager in accordance with certain aspects of the present invention.

FIG. 3A is a block diagram of one embodiment of trigger manager 180. Trigger manager 180 is shown to primarily include a trigger sequencer subsystem 232, a trigger development subsystem 304 and a trigger control system 306. Trigger development and annotation subsystem 306 provides the operator with the ability to develop and annotate trigger specifications through a user interface, implemented as a graphical user interface 116 in the illustrative embodiment. A trigger sequencer subsystem 302 receives trigger sequences 305 from trigger development subsystem 304 and interprets trigger sequences 305 using trigger control information 307 received from trigger control subsystem 304. Trigger sequencer 302 generates trigger definition signals 311 suitable for controlling signal acquisition module 122.

Trigger controls subsystem 304 enables the operator to specify the characteristics of the captured data, and provides such trigger controls 307 to signal acquisition module 122. Trigger controls 307 include, for example, count and store qualifications 327, sample rate 329, memory depth 331 and trigger position 333. These trigger controls are considered to be well known in the art and, therefore, are not described further herein.

Figure 3B:
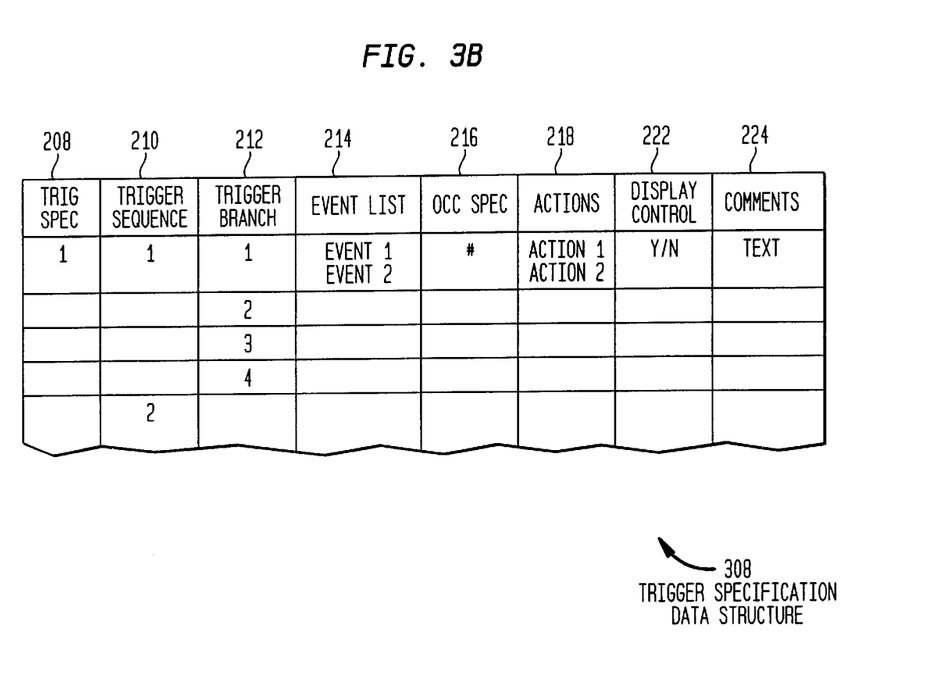
FIG. 3B is a schematic diagram of the trigger specification data structure in accordance with one embodiment of the present invention.

Trigger specification data structure 308 provides for the storage of trigger specifications 208, including trigger branch comments 224 of the present invention. Stored trigger specification 208 is utilized by trigger development subsystem 306 for display on graphical user interface 116. FIG. 3B is a schematic diagram of one embodiment of the trigger specification data stored in trigger specification data structure 308.

Referring to FIG. 3B, for each trigger specification 208 there may be one or more trigger sequences 210. Each such trigger sequence 210 includes one or more trigger branches 212. In the illustrative embodiment, each trigger sequence 210 includes up to 4 trigger branches 212. For each trigger branch 212, one or more events 214, an occurrence specification 216 and one more actions 218 are stored in data structure 308. In accordance with the disclosed aspects of the present invention, for each trigger branch 212 there is an annotation display control flag 322 and comments 224 stored in trigger specification data structure 308. The data structure 308 may take on any form now or later developed and may be accessed in any well-known manner.

Trigger development and annotation subsystem 306 interoperates with GUI 116 to display trigger branch comments adjacent or otherwise graphically associated with an associated trigger branch 212. Preferably, subsystem 306 provides a text editing environment on graphical user interface 116, displaying a text area 226 that receives characters entered into text area 226 by the operator using a keyboard, mouse or other user input device operatively coupled to signal measurement system 100. Preferably, the text editor provides the operator with common editing functions to modify or generate new trigger branch comments. These may include, for example, cut, paste and copy commands, spell checker or the like. In certain embodiments, a word processing program can be linked to trigger branch manager 180 to manage the text-editing window generated by the trigger manger for editing the trigger branch comments. The operator inputs provided to subsystem 306 to generate trigger branch comments are subsumed within the trigger specification and display control signals 342. In addition or alternatively, trigger specifications 208 may be provided through a remote source, referred to in FIG. 3A as remotely generated trigger specification 340.

When either display control flag 322 or trigger branch comment 224 change, trigger specification data structure 308 is updated with the new information and the display is updated in accordance with the current display mode for the trigger sequence. Techniques that are considered to be well-known to those of ordinary skill in the relevant art may be employed to display trigger branch comments at the desired location and in the desired graphical method so that they are visually associated with the subject trigger branch by the viewing operator. For example, when in read-only mode, as shown in region 220 of FIG. 2, the trigger branch comments 224 are displayed as simple text lines with minimal space between characters and lines of characters. In the text edit display mode, the trigger branch comment 224D is presented in a text edit box providing sufficient room to enter in additional text.

Figure 4A:
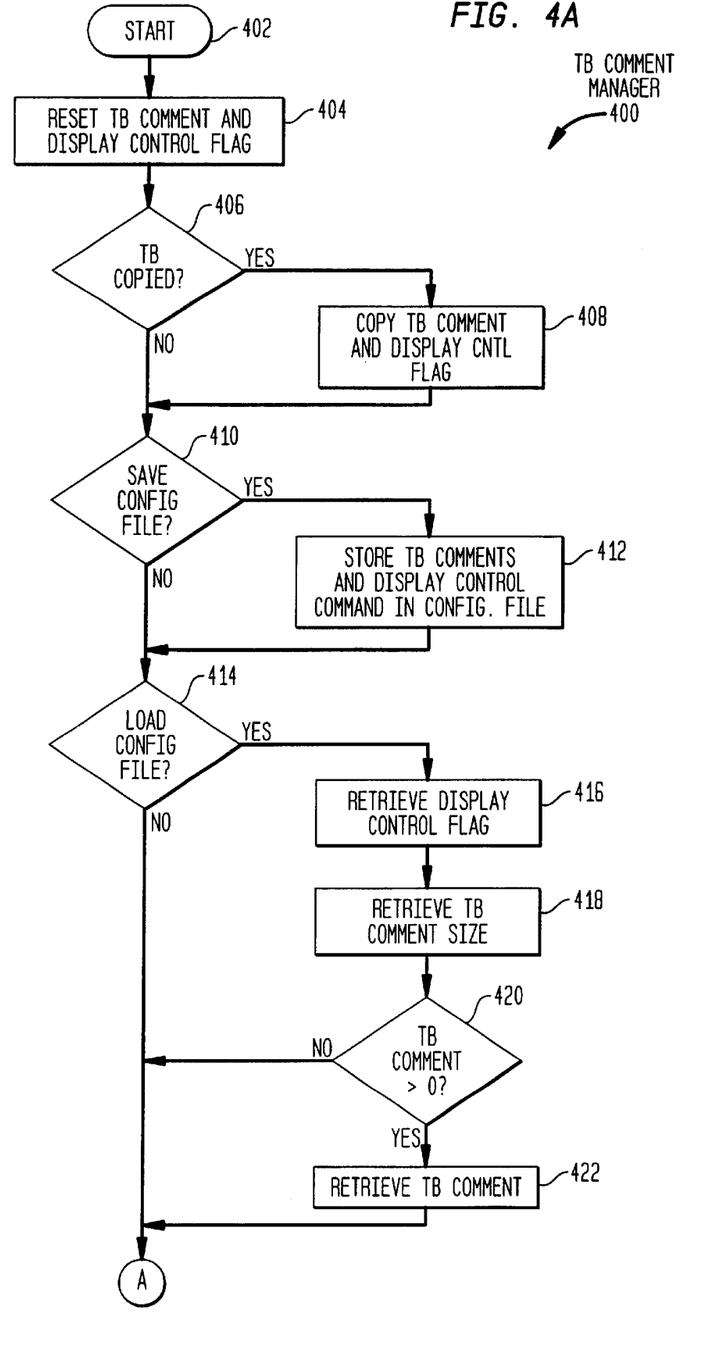
FIGS. 4A and 4B are a flow chart illustrating the processes performed to manage the development of trigger branch comments in accordance with one embodiment of the present invention.
Figure 4B:
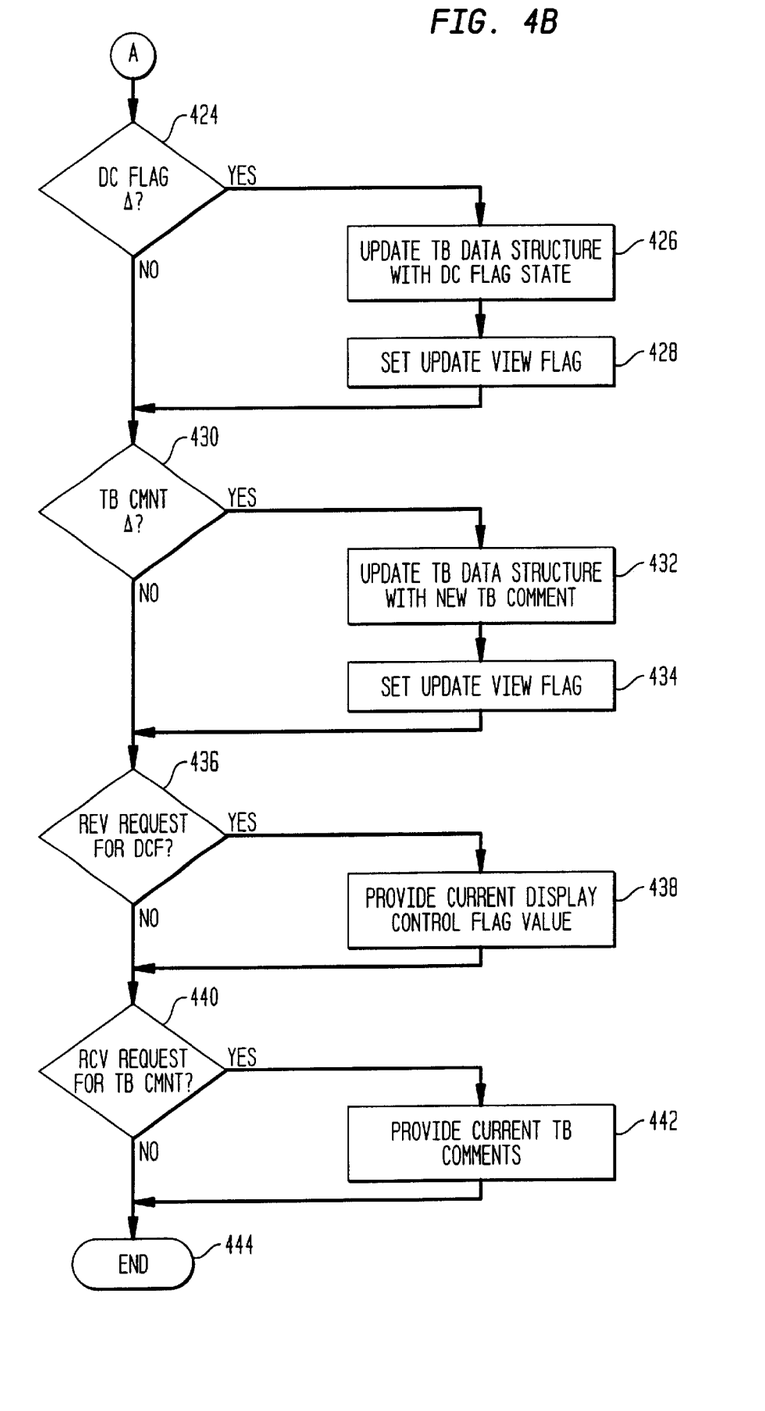
Figure 5:
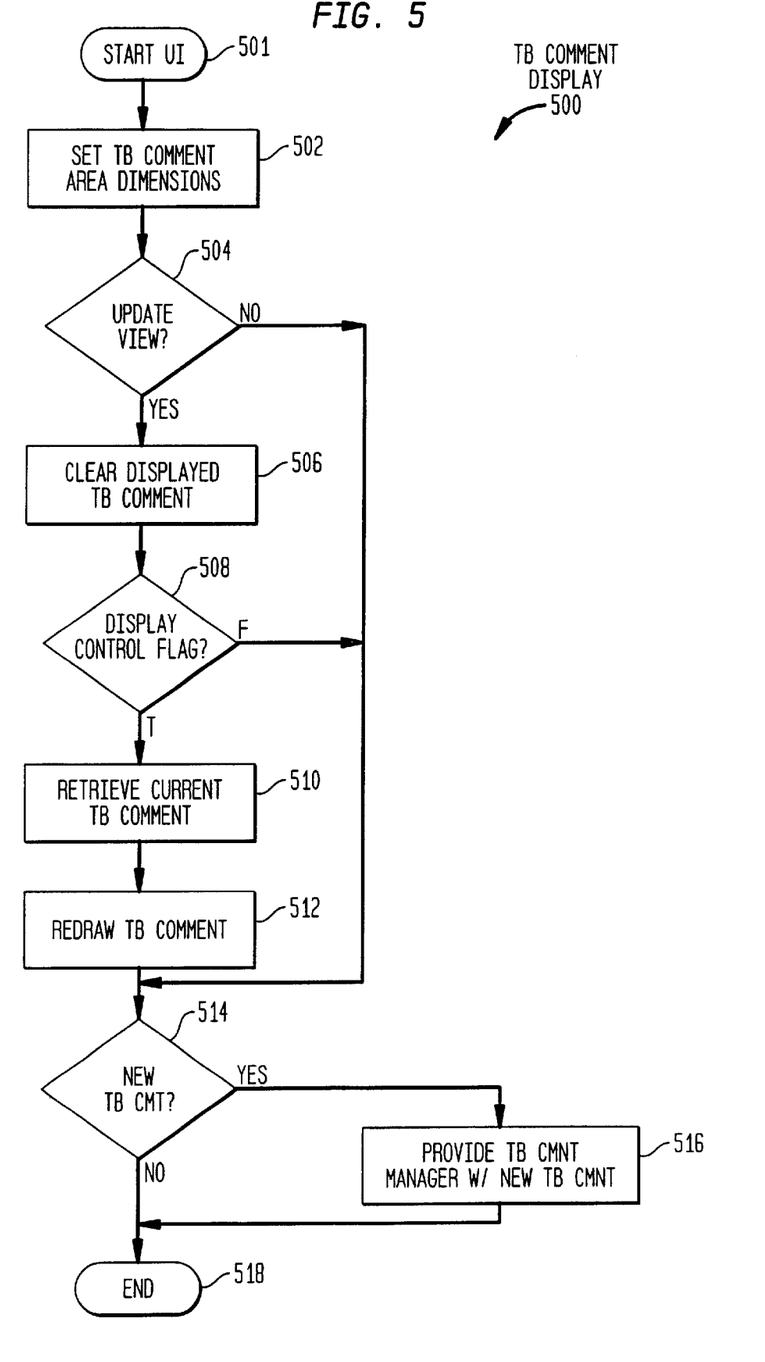
FIG. 5 is a flow chart illustrating the processes performed to manage the display of trigger branch comments in accordance with one embodiment of the present invention.

FIGS. 4A and 4B together illustrate a flow chart of the processes performed in accordance with one embodiment of the present invention to manage operator-generated trigger branch comments adjacent to an associated trigger branch. The operations performed by trigger display and annotation subsystem 306 related to the annotation operations of the present invention are allocated to two processes. FIGS. 4A and 4B are a flow chart illustrating a trigger branch management process 400 while FIG. 5 is a flow chart illustrating a user interface management process 500. Each of these processes will be described in detail below in the context of the embodiments of the invention described above.

In those embodiments in which trigger development and annotation subsystem 306 is a software program, it is anticipated that an instance of process 400 will be invoked for each trigger branch comment 224 that is allocated.

Process 400, therefore, begins at start block 402 in response to an invocation of an associated trigger branch. As noted above, embodiments of the present invention provide the operator with the capability of controlling the display of the trigger branch comments 224 for each branch 212 individually or collectively. Since there is a process 400 operating to control the generation and display of a single trigger branch comment, a single trigger branch comment 224 and a single annotation display control flag 322 are managed in the processes 400 and 500 described below.

After start block 402, processing at block 404 causes the resetting or clearing of the trigger branch comments 224 displayed on user interface 116. In addition, the annotation display control flag 322 is reset to false. At block 406, it is determined whether the associated trigger branch has been copied. In this illustrative embodiment, an indication that the operator has requested that the trigger branch be copied is received by trigger annotation manager 350. This may occur, for example, when the operator attempts to copy a trigger branch to another trigger sequence for subsequent modification. Upon receipt of the request, processing continues at block 408 at which a copy of the trigger branch comments 224 and the display control flag 322 are generated and provided in response to the request.

At blocks 410 through 414 configuration save and restore operations are performed. At block 410 a determination is made of whether an indication that the configuration file is to be saved has been received. If so, then processing continues at block 412 at which trigger branch comments 224 and display control flag 322 are saved in the specified Instrument configuration file. For example, in one embodiment, the comments 224 and flag 322 may be streamed to disk using well-known techniques. At block 414 a determination is made as to whether a stored configuration file is to be loaded into signal measurement system 100. If so, then the trigger annotation data is retrieved from the configuration file at block 416. First, display control flag 322 is retrieved from configuration memory. Then, the size of the stored trigger branch comment 224 is retrieved to determine whether there are trigger branch comments to be retrieved. A trigger branch size of zero indicates there is no trigger branch comment included in the configuration file. Processing then continues at block 424. However, if there is a trigger branch comment 224 stored in the configuration file, then processing continues at block 422 at which the appropriate space is allocated based on the size retrieved at block 418 and the trigger branch comment 224 is retrieved. In these operations trigger branch comments 224 and annotation display control flag 322 are stored in trigger specification data structure 308 as noted above.

At blocks 424 through 434 operations are performed related to the display of the trigger branch comments 224 stored in the trigger specification data structure 308 described above. At block 424 a determination is made as to whether display control flag 322 has been changed. If so, then the trigger specification data structure 308 is updated with the new state of display control flag 322 at block 426. Then, an update view flag 326 is set to indicate to user interface control process 500 that the display of the trigger branch comment 224 needs to be updated to reflect the new information. Similarly, at block 430 a determination is made as to whether trigger branch comment 224 has been changed. If so, then the new trigger branch comment 20 is stored in trigger specification data structure 308 at block 432. As noted, in certain embodiments, the operator may change a trigger branch comment 224 through the user of a text editor presented on graphical user interface 116.

However, there are other technologies that may be employed to enable the operator to change or crate a trigger branch comment. For example, in one embodiment, trigger branch comments 224 may be changed programmatically, such as through a command line interface. In such circumstances the trigger branch comment currently displayed will not reflect this modification. As a result, the update view flag 326 is set at block 434. As will be described in detail below, user interface control process 500 utilizes update view flag 326.

The remaining operations performed by process 400 provide trigger branch comment 224 and annotation display control flag 322 to those processes that request such information. At block 436 a determination is made as to whether such a request was received for display control flag 322. If so, then processing advances to block 438 at which the current state of the display control flag 322 is returned to the requesting process. Similarly, a determination is made at block 440 as to whether trigger branch comments 224 have been requested. If so then the processing continues at block 442 at which the current trigger branch comment is returned to the requesting process. Processing ceases at block 444.

As noted, a flow chart of user interface control process 500 is illustrated in FIG. 5. At block 502 the size of the area dedicated to the display of trigger branch comment 224 is determined. There may be a default value for both the width (columns) as well as the length (rows) of the trigger branch comment display area 226. In addition, either or both attributes may be configured so that it does or does not change dynamically as the trigger branch comments 224 are entered into the comment area 226. In one embodiment, the rows and the columns expand as necessary to enable the operator to enter a trigger branch comment 224 that is significant in size. In alternative embodiments, the rows and the columns of the trigger branch comment area 226 are maintained as constant values, preventing the operator from entering trigger branch comments 224 beyond a particular length.

At block 504 the state of update view flag 326 is determined. As noted, update view flag 326 is set when either the annotation display control flag 322 or the trigger branch comment 224 has been changed in some manner. If update view flag 326 has been changed, then processing continues at block 506 at which the trigger branch comment 224 is cleared. Then at block 508 the state of display control flag 322 is determined. If the flag is true, then either the operator just attempted to display a trigger branch comment that was not displayed previously, causing the display control flag to change from a false to a true state. Alternatively, trigger branch comment 224 has been changed.

Processing advances to block 510 at which the current trigger branch comment 224 is retrieved from trigger specification data structure 308 and the user interface is redrawn at block 512. This results in a display of the trigger specification with the appropriate trigger branch comment 224 displayed.

In this illustrative embodiment, user interface control process 500 inter-operates with graphical user interface 116 to manage the display of the trigger specification in general and the trigger branch comments in particular. As noted previously, the operator can alter the display mod of a trigger sequence from a read-only to an edit display mode. In the edit display mode the operator can either modify or generate new trigger branch comments. When the operator is completed with the editing operation, as indicted by the selection of a point in the display that is not with in the trigger branch display area, hitting the enter key or the like, the new trigger branch comment 224 is provided to the trigger branch comment manager process 400 at block 526. Processing then ceases at block 518.

While various embodiments of the present invention have been described above, it should be understood that they have been presented by way of example only, and not limitation. For example, exemplary aspects of the present invention have been described in relation to a logic analyzer. It should be apparent to those of ordinary skill in the art that the present invention may be implemented in any signal measurement system that acquires and stores signal data in accordance with a trigger specification. For example, the present invention may be implemented in a digital oscilloscope, protocol analyzer, microprocessor emulator, bit error rate tester, network analyzer, etc. It should also be understood that the flow charts provide just one exemplary implementation of the invention. In alternative embodiments, the described functions may be implemented as individual, interrupt-driven functions in, for example, the C++ programming language. It should also be understood that the graphical user interface displays illustrated in FIG. 2 is exemplary only. For example, in the illustrative embodiment, the display elements are in the form of buttons and window tabs. It should be understood that this is simply one of numerous approaches that may be used to present display elements for selection or data entry by the operator. Such display elements may be provided in accordance with graphical user interface display techniques now or later developed. For example, icons, menu lists, pop-up menus, scroll lists, and other such graphical display elements may be used in any combination to present the same or similar information to the operator. All such implementations are considered to be well known in the relevant art and are also considered to be within the scope of the present invention. Thus, the breadth and the scope of the present invention are not limited by any of the above exemplary embodiments, but are defined only in accordance with the following claims and their equivalents.

What is claimed is:

1. A system for use in a signal measurement device that acquires and stores signal data in accordance with a trigger specification comprising a plurality of trigger specification elements each including any of the group consisting of a trigger sequence, a trigger branch, a trigger action, a trigger branch condition, a trigger event, and an occurrence specification, the system comprising:
   a trigger manager configured to display on a user interface operatively coupled to the device at least one trigger specification element and an annotation graphically associated with a selected one or more of the at least one displayed trigger specification elements, wherein the trigger manager can operate in accordance with a plurality of display modes comprising:
      a read-only mode wherein a first portion of the plurality of trigger specification elements is displayed such that the operator cannot generate or modify any annotation graphically associated with the first portion; and
      an edit mode wherein a second portion of the plurality of trigger specification elements is displayed such that the operator can generate or modify any annotation graphically associated with the second portion.

2. The system of claim 1, wherein the generating and modifying means comprises:
   a text editor that displays a text edit area on the user interface through which the operator can enter text or commands to create and modify the operator-generated annotation.

3. The system of claim 1, wherein the selected trigger specification element is a trigger branch; and wherein the annotation is a trigger branch comment.

4. The system of claim 3, wherein the graphical association comprises displaying the trigger branch comment adjacent to and above the selected trigger branch.

5. The system of claim 1, wherein the selected trigger specification element is a trigger branch displayed with a trigger event as a subject to a displayed Boolean "if," "else if," or "else" statement, and displayed with a trigger action as a subject to a displayed Boolean "then" statement.

6. The system of claim 1, wherein the operator can select the display mode of the trigger manager.

7. The system of claim 1, wherein the system logically relates the annotation to the selected trigger specification element.

8. The system of claim 7, wherein the system stores the annotation with the selected trigger specification element in a data structure.

9. A method for displaying operator-generated annotations on a user interface of a signal measurement device that acquires and stores signal data in accordance with a trigger specification comprising at least one trigger specification element, each including any of the group consisting of a trigger sequence, a trigger branch, a trigger action, a trigger branch condition, a trigger event and an occurrence specification, the method comprising:
   displaying a plurality of trigger specification elements in accordance with one of a plurality of display modes comprising a read-only mode wherein a first at least one trigger specification element is displayed such that the operator cannot generate or modify any annotation graphically associated with the first at leas one trigger specification element; and an edit mode wherein a second at least one trigger specification element is displayed such that the operator can generate or modify any annotation graphically associated with the second at least one trigger specification element;
   receiving an indication of an operator's selection of said second at least one trigger specification element;
   displaying an annotation related to the first portion of the selected trigger specification element;
   displaying a text edit field that allows the operator to generate an annotation related to each of the second at least one selected trigger specification element; and
   displaying each annotation in graphical association with its related trigger specification element.

10. The method of claim 9, wherein the selected trigger specification element is a trigger branch displayed with a trigger event as a subject to a displayed Boolean "if," "else if," or "else" statement, and displayed with a trigger action as a subject to a displayed Boolean "then" statement.

11. The method of claim 9, wherein the annotation is displayed adjacent to the selected trigger specification element.

12. The method of claim 9, wherein the annotation is displayed adjacent to and above the selected trigger specification element.

13. The method of claim 9, further comprising: logically relating the annotation to the selected trigger specification element.

14. The method of claim 13, wherein the annotation is related to the selected trigger specification element by storing the annotation with the selected trigger specification element in a data structure.

* * * * *